US012484417B2

(12) United States Patent
Zhang

(10) Patent No.: US 12,484,417 B2
(45) Date of Patent: Nov. 25, 2025

(54) FLEXIBLE DISPLAY PANEL AND FLEXIBLE DISPLAY DEVICE

(71) Applicant: Wuhan China Star Optoelectronics Semiconductor Display Technology Co., Ltd., Wuhan (CN)

(72) Inventor: Yang Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/622,151

(22) PCT Filed: Dec. 14, 2021

(86) PCT No.: PCT/CN2021/137880
§ 371 (c)(1),
(2) Date: Dec. 22, 2021

(87) PCT Pub. No.: WO2023/102967
PCT Pub. Date: Jun. 15, 2023

(65) Prior Publication Data
US 2024/0324403 A1    Sep. 26, 2024

(30) Foreign Application Priority Data
Dec. 9, 2021    (CN) .......................... 202111495895.7

(51) Int. Cl.
*H10K 59/80*    (2023.01)
*H10K 102/00*    (2023.01)

(52) U.S. Cl.
CPC ... *H10K 59/8721* (2023.02); *H10K 2102/311* (2023.02)

(58) Field of Classification Search
CPC .............. H01L 51/0097; H10K 77/111; H10K 59/8721; H10K 2102/311; G09F 9/301
See application file for complete search history.

(56) References Cited

U.S. PATENT DOCUMENTS

2017/0338294 A1    11/2017 Choi et al.
2022/0063233 A1*    3/2022 Lee .......................... B32B 27/08

FOREIGN PATENT DOCUMENTS

| CN | 108628500 A | 10/2018 |
|---|---|---|
| CN | 110853510 A | 2/2020 |
| CN | 210955911 U | 7/2020 |
| CN | 111739423 A | 10/2020 |
| CN | 112086495 A | 12/2020 |
| CN | 213150201 U | 5/2021 |
| CN | 112927628 A | 6/2021 |

(Continued)

*Primary Examiner* — Suberr L Chi
(74) *Attorney, Agent, or Firm* — Nathan & Associates Patent Agents Ltd.; Menachem Nathan

(57) ABSTRACT

The present application provides a display panel and a display device, and the display panel comprises a flexible display panel main body and a support layer. The support layer comprises a support part and a end part. The flexible display panel main body is configured to surround the transition surface of the end part and is arranged on the second surface of the plane support part, to reduce the stress during the bending process of the flexible display panel main body to avoid the concentration of wiring stress, thereby reducing the risks of breakages in the wirings inside the display panel.

20 Claims, 3 Drawing Sheets

(56) References Cited

FOREIGN PATENT DOCUMENTS

| CN | 112951890 | A | 6/2021 |
| CN | 113674624 | A | 11/2021 |
| KR | 20150063876 | A | 6/2015 |
| WO | 2021164510 | A1 | 8/2021 |

* cited by examiner

FLEXIBLE DISPLAY PANEL AND FLEXIBLE DISPLAY DEVICE

FIELD OF THE INVENTION

The present invention relates to a display field, and more particularly to a display panel and a display device.

BACKGROUND OF THE INVENTION

With the changes in people's aesthetic level and the development of mobile terminal products, full screen is an inevitable trend in the development of mobile terminal products.

Flexible organic light emitting diode (OLED) display panels are widely used in various display devices due to their bendable characteristics and the ability of flexible display panels to bend and display under certain conditions.

At present, the manufacturing technology of the display panel is not mature enough to realize a full-screen display of the display panel. In order to achieve the full-screen display of the display panel as possible, the wiring area and the bonding area at the bottom of the display panel can be bent to the back of the display panel through a pad bending process, so as to narrow the bottom frame. However, the existing bonding process is only applicable when the bottom of the display panel is a plane. When the bottom of the display panel is curved, it is easy to bend badly during the bonding process. Problems such as tearing between the various film layers in the display panel, excessive bending stress between the various film layers, and cracks or breakages in the wirings.

In summary, the existing display panel has the problem of cracks in the wiring during the bonding process. Therefore, there is a need to provide a display panel and a display device to improve this defect.

SUMMARY OF THE INVENTION

The embodiment of the present application provides a display panel and a display device, which are employed to solve the problem of cracks in the wiring during the bonding process of the existing display panel.

The embodiment of the present application provides a display panel, comprising:
  a flexible display panel main body comprising a plane area, a bending area connected to the plane area and a bonding area connected to the bending area; and
  a support layer, wherein the support layer comprises:
  a plane support part comprising a first surface and a second surface which are oppositely arranged; and
  an end part comprising a transition surface, wherein the transition surface is respectively connected to the first surface and the second surface;
  wherein at least part of the transition surface is a curved surface, and the plane area is at least partially arranged on the first surface, and the bending area is arranged on the transition surface, and the bonding area is arranged on the second surface.

According to one embodiment of the present application, the transition surface comprises:
  a first curved surface; and
  a second curved surface connected to an end of the first curved surface away from the first surface;
  wherein a curvature of the first curved surface is smaller than a curvature of the second curved surface.

According to one embodiment of the present application, the flexible display panel main body comprises the plane area and the bending area provided at least one end of the plane area;
  wherein the bending area comprises:
  first sub-bending area attached to the first curved surface; and
  a second sub-bending area possessing a gap with the second curved surface.

According to one embodiment of the present application, the display panel further comprises a protective layer arranged on a side of the second sub-bending area away from the end part.

According to one embodiment of the present application, the transition surface comprises a first connecting surface, and the first connecting surface is respectively connected to the first surface and the first curved surface;
  wherein the first connecting surface is a straight surface.

According to one embodiment of the present application, the transition surface comprises a second connecting surface, and the second connecting surface is respectively connected to the second curved surface and the second surface;
  wherein at least part of the second connecting surface is a curved surface.

According to one embodiment of the present application, a thickness of the end part is greater than a thickness of the plane support part.

According to one embodiment of the present application, in a direction from a side of the end part away from the plane support part to a side of the end part close to the plane support part, the thickness of the end part gradually increases and then gradually decreases.

According to one embodiment of the present application, a material of the support layer comprises metal.

The embodiment of the present application further provides a display device, comprising a display panel, wherein the display panel comprises:
  a flexible display panel main body comprising a plane area, a bending area connected to the plane area and a bonding area connected to the bending area; and
  a support layer, wherein the support layer comprises:
  a plane support part comprising a first surface and a second surface which are oppositely arranged; and
  an end part comprising a transition surface, wherein the transition surface is respectively connected to the first surface and the second surface;
  wherein at least part of the transition surface is a curved surface, and the plane area is at least partially arranged on the first surface, and the bending area is arranged on the transition surface, and the bonding area is arranged on the second According to one embodiment of the present application, the transition surface comprises:
  a first curved surface; and
  a second curved surface connected to an end of the first curved surface away from the first surface;
  wherein a curvature of the first curved surface is smaller than a curvature of the second curved surface.

According to one embodiment of the present application, the flexible display panel main body comprises the plane area and the bending area provided at least one end of the plane area;
  wherein the bending area comprises:
  first sub-bending area attached to the first curved surface; and a second sub-bending area possessing a gap with the second curved surface.

According to one embodiment of the present application, the display panel further comprises a protective layer arranged on a side of the second sub-bending area away from the end part.

According to one embodiment of the present application, the transition surface comprises a first connecting surface, and the first connecting surface is respectively connected to the first surface and the first curved surface;

wherein the first connecting surface is a straight surface.

According to one embodiment of the present application, the transition surface comprises a second connecting surface, and the second connecting surface is respectively connected to the second curved surface and the second surface;

wherein at least part of the second connecting surface is a curved surface.

According to one embodiment of the present application, a thickness of the end part is greater than a thickness of the plane support part.

According to one embodiment of the present application, in a direction from a side of the end part away from the plane support part to a side of the end part close to the plane support part, the thickness of the end part gradually increases and then gradually decreases.

According to one embodiment of the present application, a material of the support layer comprises metal.

The benefits of the present disclosure are: the embodiment of the present application provides a display panel and a display device, and the display panel comprises a flexible display panel main body and a support layer. The support layer comprises a support part and a end part. The plane support part comprises a first surface and a second surface which are oppositely arranged. The end part comprises a transition surface, and the transition surface is respectively connected to the first surface and the second surface. At least part of the transition surface is a curved surface. A part of the flexible display panel main body is arranged on the first surface, and another part of the flexible display panel main body is configured to surround the transition surface and to be arranged on the second surface. The end part can provide support for the flexible display panel main body. The curved surface of the transition surface can make the flexible display panel main body possess a smoother transition as bending, and reduce the stress during the bending process of the flexible display panel main body to avoid the concentration of wiring stress, thereby reducing the risks of breakages in the wirings during the bonding process of the display panel.

BRIEF DESCRIPTION OF THE DRAWINGS

In order to more clearly illustrate the embodiments of the present disclosure or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

Figure 1:
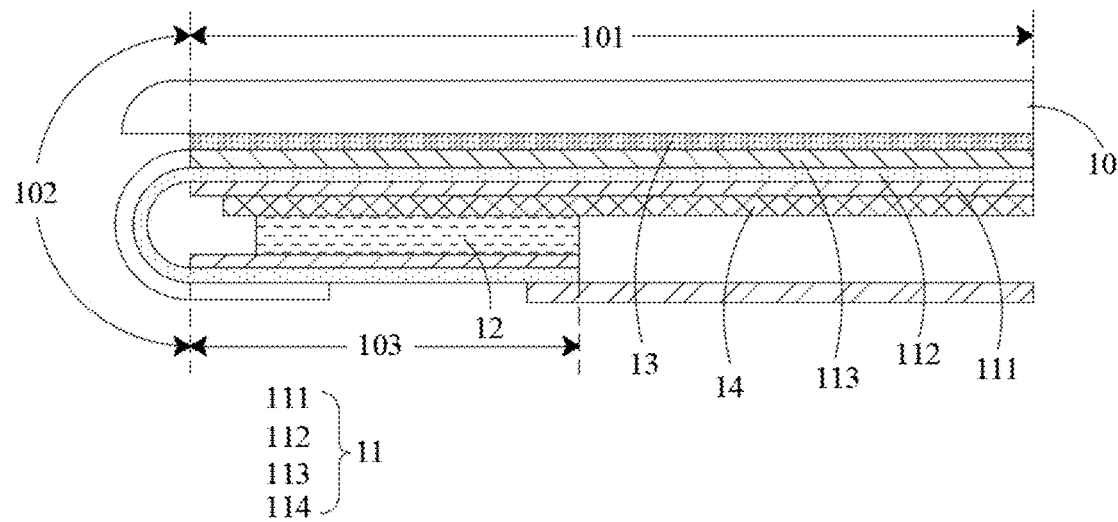
FIG. 1 is a film structural diagram of a display panel in the prior art.

The following descriptions for the respective embodiments are specific embodiments capable of being implemented for illustrations of the present application with referring to appended figures. The terms of up, down, front, rear, left, right, interior, exterior, side, etcetera in the present application are merely directions of referring to appended figures. Thus, the used directional terms are used to describe and understand the present application, but the present invention is not limited thereto. In the figure, units with similar structures are denoted by the same reference numerals.

The present disclosure will be further described in detail with the accompanying drawings and the specific embodiments.

With the continuous development of display panel manufacturing technology, display panels have gradually developed toward full-screen and bendable or foldable fields. However, during the bonding process of the existing display panel, the stress distribution at the bent part is not uniform, and the bending effect of the film layer corresponding to the bent part is not ideal, resulting in problems such as cracks or breakages in the wiring of the bent part. The embodiment of the present application provides a display panel and a display device to optimize the bending performance and display performance of the bending part of the display panel, reduce the risk of cracks or breakages in the wirings of bent part, and to improve the quality and overall performance of display panels and display devices.

As shown in FIG. 1, FIG. 1 is a film structural diagram of a display panel in the prior art. The display panel comprises a cover plate 10 and a flexible display panel main body 11, and the flexible display panel main body 11 comprises a back plate 111, a display layer 112 and a polarizer 113 stacked in sequence. The flexible display panel body 11 has a plane area 101, a bending area 102 and a bonding area 103. A flexible printed circuit board 114 is bonded to one end of the bonding area 103, and the flexible printed circuit board 114 can be configured with the bonding area 103 to be bent to the back of the plane area 101. The bottom of the display layer 112 located at the plane area 101 and the bonding area 103 is provided with a back plate 111. The back plate 111 is employed to support and maintain the flatness of the plane area 101 and the bonding area 103. A composite heat dissipation film 14 is provided at the bottom of the back plate 111 for supporting the plane area 101. The composite heat dissipation film 14 can be formed by stacking stainless steel (SUS), copper and foam in sequence, which can provide functions of heat dissipation and electromagnetic shielding. A backing 12 is provided between the composite heat dissipation film 14 and the back plate 111 for supporting the binding area 103. The plane area 101 of the display panel main body 11 and the bonding area 103 are spaced apart by the backing 12 so that the display panel main body 11 forms a curved shape with a certain bending radius in the bending area 102. The cover plate 10 is a straight cover plate, and the plane area 101 of the flexible display panel main body 11 is attached to the cover plate 10 through the optical glue 13.

Figure 2:
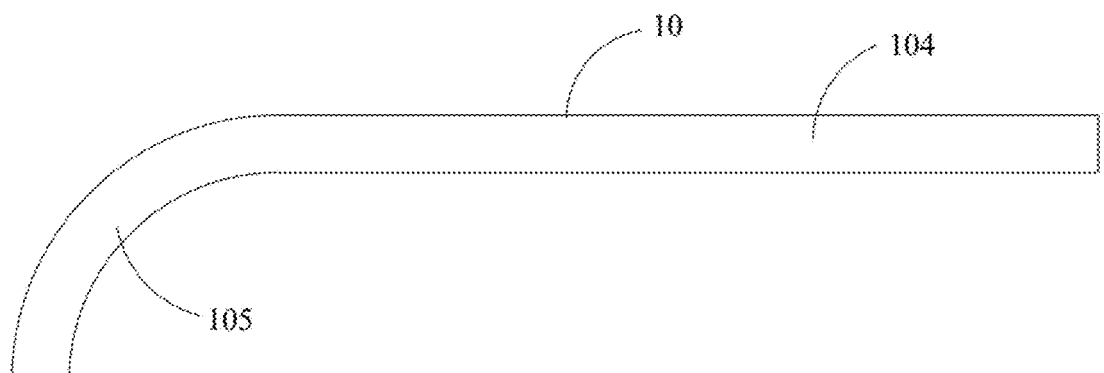
FIG. 2 is a structural diagram of a cover plate in the prior art.

As shown in FIG. 2, FIG. 2 is a structural diagram of a cover plate in the prior art. When the cover plate 10 possesses a straight part 104 and a bending part 105 located at least one end of the straight part 104, the backing 12 in a straight shape in FIG. 1 cannot effectively support the flexible display panel main body 11. This does not only make it difficult for the flexible display panel main body 11 to form a curvature that matches the curved surface of the cover plate 10, but also increases the difficulty of the bonding process, resulting in that the flexible display panel body 11 cannot be effectively attached to the curved part of the cover plate 10. Accordingly, due to the lack of effective support of the backing 12 in the bending area 102, the wiring in the bending area 102 is prone to cracks or breakages during the bonding process.

The embodiment of the present application provides a display panel and a display device. The display device comprises the display panel. The display device may be a mobile terminal, such as a smart phone, a tablet computer, a notebook computer, etc. The display device may also be a wearable terminal, such as a smart watch, a smart bracelet, smart glasses, and an augmented reality equipment, etc. The display device may also be a fixed terminal, such as a desktop computer, a television and the like.

Figure 3:
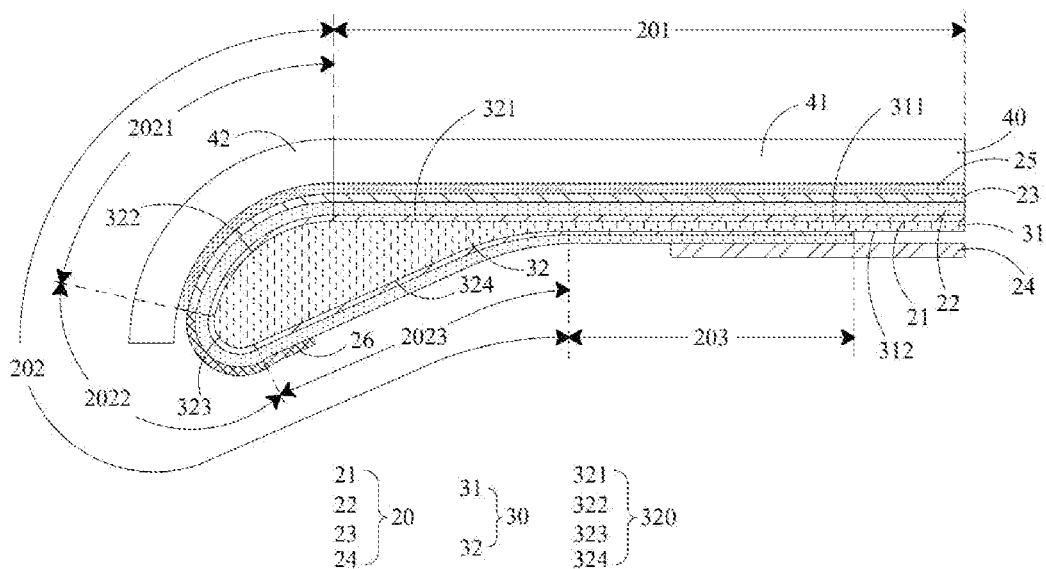
FIG. 3 is a partial structural diagram of a display panel provided by an embodiment of the application.

As shown in FIG. 3, FIG. 3 is a partial structural diagram of a display panel provided by an embodiment of the application. The display panel comprises a flexible display panel main body 20 and a support layer 30. The support layer 30 is arranged at the bottom of the flexible display panel main body 20 for supporting the flexible display panel main body 20.

The flexible display panel main body 20 comprises a back plate 21, a display layer 22 and a polarizer 23 stacked in sequence. When the flexible display panel main body 20 is not bent, the back plate 21, the display layer 22 and the polarizer 23 are all in a flat and unbent state, that is, each film layer in the flexible display panel main body 20 is a straight state. Since the flexible display panel main body 20 in the embodiment of the present application can be bent or folded, each film layer in the flexible display panel main body 20 will also change with the bending or folding of the flexible display panel main body 20.

The display panel further comprises a cover plate 40, and the cover plate 40 is a cover glass (CG). The cover plate 40 comprises a straight part 41 and a bending part 42 located at least one end of the straight part 41. The bending part 42 is smoothly transitioned and connected to the straight part 41, and the bending part 42 is curved toward one side of the flexible display panel main body 20. The inner side of the cover plate 40 is employed for accommodating the flexible display panel main body 20. The cover plate 40 and the flexible display panel main body 20 are attached to each other through an optical glue 25 to form a display panel with at least one curved surface.

Figure 4:
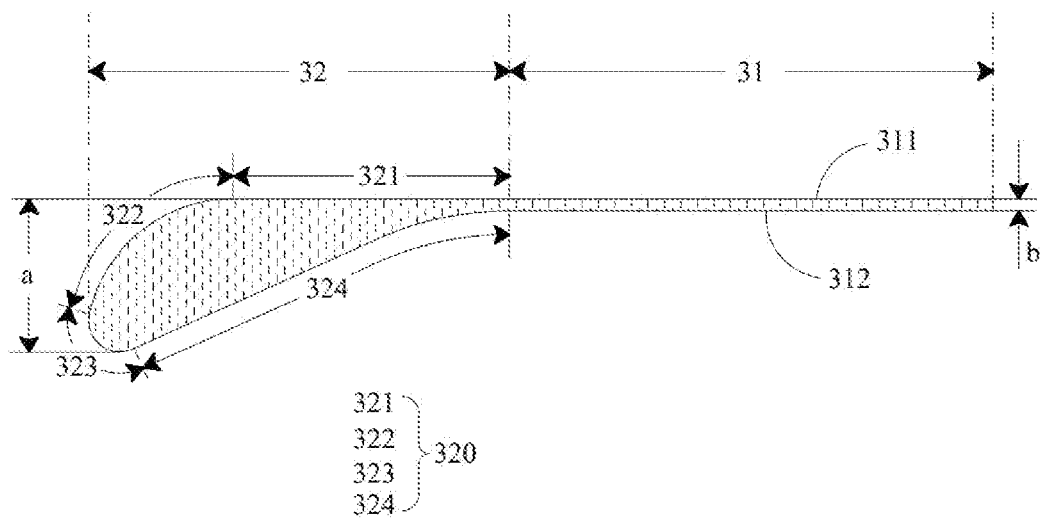
FIG. 4 is a partial structural diagram of a support layer provided by an embodiment of the application.

Furthermore, as shown in FIG. 4, FIG. 4 is a partial structural diagram of a support layer provided by an embodiment of the application. The support layer 30 comprises a support part 31 and a end part 32. The end part 32 is arranged at least one end of the support part 31. The end part 32 and the plane support part 31 are integrally formed. The plane support part 31 comprises a first surface 311 and a second surface 312 which are oppositely arranged. The first surface 311 and the second surface 312 are both straight surfaces. The end part 32 comprises a transition surface 320, and the transition surface 320 is respectively connected to the first surface 311 and the second surface 312.

As shown in FIG. 3 and FIG. 4, a part of the flexible display panel main body 20 is arranged on the first surface 311, and another part of the flexible display panel main body 20 is configured to surround the transition surface 320 and to be arranged on the second surface 312.

As shown in FIG. 3, in the embodiment of the present application, the flexible display panel main body 20 comprises a plane area 201, a bending area 202 and a bonding area 203. The bending area 202 is located between the plane area 201 and the bonding area 203. Both at least a part of the plane area 201 and at least a part of the bending area 202 can realize the function of image display. The flexible display panel main body 20 further comprises a flexible printed circuit board 24, and the flexible printed circuit board 24 is bonded to the bonding area 203.

A part of the plane area 201 is arranged on the first surface 311, and another part of the plane area 201 is arranged on the part where the transition surface 320 and the first surface 311 are connected.

At least part of the transition surface 320 is a curved surface, and the bending area 202 is arranged on the transition surface 320. During the bonding process, the bending area 202 can be attached along the transition surface 320, so that the bending area 202 can be smoothly transitioned at the end part 32 to reduce the stress of the bending area 202 of the flexible display panel main body 20 at the end part 32, thereby reducing the risks of breakages in the wirings in the bending area 202.

The bonding area 203 is arranged on the second surface 312. The flexible printed circuit board 24 is bonded to a side of the bonding area 203 away from the second surface 312.

Furthermore, as shown in FIG. 3 and FIG. 4, the transition surface 320 comprises a first connecting surface 321, a first curved surface 322, a second curved surface 323 and a second connecting surface 324. The first connecting surface 321 is respectively connected to the first surface 311 and the first curved surface 322. The second curved surface 323 is respectively connected to the first curved surface 322 and the second connecting surface 324. The second connecting surface 324 is further connected to the second surface 312.

The first connecting surface 321 is a straight surface and is on the same level as the first surface 311. The plane area 201 of the flexible display panel main body 20 is arranged on the first surface 211 and the first connecting surface 321.

AS shown in FIG. 3, the bending area 202 of the of the flexible display panel main body 20 comprises a first sub-bending area 2021 and a second sub-bending area 2022. The first sub-bending area 2021 is arranged between the plane area 201 and the second sub-bending area 2022. The first sub-bending area 2021 is arranged on the first curved surface 322 and is attached to the first curved surface 322. The second sub-bending area 2022 is arranged on the second curved surface 323 and possesses a gap with the second curved surface 323.

The polarizer 23 covers the surfaces of the plane area 201 and the first sub-bending area 2021, so that both the plane area 201 and the first sub-bending area 2021 can realize the function of image display.

The bending area 202 further comprises a third sub-bending area 2023, and the third sub-bending area 2023 is arranged on the second connecting surface 324 and is attached to the second connecting surface 324.

Furthermore, as shown in FIG. 3, the back plate 21 comprises two parts, which are spaced apart. One part is arranged at the bottom of the display layer 22 corresponding to the plane area 201 and the first sub-bending area 2021, and the other part is arranged at the bottom of the display layer 22 corresponding to the third sub-bending area 2023 and the bonding area 203. The bottom of the second sub-bending area 2022 is not provided with a back plate 21, so that a gap is formed between the second sub-bending area 2022 and the second curved surface 323 of the end part 32. This gap can provide space for accommodating the deformation of the second sub-bending area 2022, avoiding the end part 32 from squeezing the second sub-bending area 2022 during the bonding process, and reducing the concentrated stress of the second sub-bending area 2022 during the bonding process, thereby reducing the risk of cracks or breakages in the wirings in the second sub-bending area 2022.

In the embodiment of the present application, the curvature of the first curved surface 322 depends on the degree of curvature of the bending part 42 of the cover plate 40. The greater the degree of curvature of the bending part 42 of the cover plate 40, the greater the curvature of the first curved surface 322. The curvature of the first sub-bending area 2021 of the flexible display panel main body 20 is adapted to the bending part 42 of the cover plate 40, and the curvature of the first curved surface 322 is adapted to the curvature of the first sub-bending area 2021.

The curvature of the second curved surface 323 depends on the bending angle of the second sub-bending area 2022. The greater the bending angle of the second sub-bending area 2022, the greater the curvature of the second curved surface 323. The curvature of the second curved surface 323 is adapted to the curvature of the second sub-bending area 2022 of the flexible display panel main body 20.

Furthermore, the curvature of the first curved surface 322 is smaller than the curvature of the second curved surface 323. It is understandable that during the bonding process of the bending area 202 of the flexible display panel main body 20, the first sub-bending area 2021 is first attached to the first curved surface 322, and the second sub-bending area 2022 is then bent. By limiting the curvature of the first curved surface 322 to be smaller than the curvature of the second curved surface 323, the curvature of the first sub-bending area 2021 can be made smaller than the curvature of the second sub-bending area 2022. The curvature of the bending area 202 gradually increases from the first connecting surface 321 to the second curved surface 323, so that the flexible display panel main body 20 can make a smoother transition. The risk of a sudden change in stress in the bending area 202 causing cracks or breakages in the wirings in the bending area 202 is reduced.

Furthermore, at least part of the second connecting surface 324 is a curved surface.

As shown in FIG. 3, the part between the end of the second connecting surface 324 connecting the second curved surface 323 and the end of the second connecting surface 324 close to the second surface 312 is an inclined straight surface. A certain included angle is formed between the inclined straight surface and the second surface 312, and the included angle is an obtuse angle. The third sub-bending area 2023 is arranged on the second connecting surface 324 and is attached to the second connecting surface 324.

It is understandable that the third sub-bending area 2023 is straight before bonding. By arranging the part between the end of the second connecting surface 324 connecting the second curved surface 323 and the end of the second connecting surface 324 close to the second surface 312 to be an inclined straight surface, the deformation amount of the third sub-bending area 2023 during the bending process can be reduced or the deformation can be avoided. Thus, the extrusion stress in the third sub-bending area 2023 can be reduced, and the risk of cracks or breakages in the wirings due to the extrusion stress in the third sub-bending area 2023 can be reduced.

The part connecting the second connecting surface 324 and the second surface 312 is a curved surface. Then, the inclined second connecting surface 324 can be smoothly transitioned to the horizontal second surface 312, to avoid the stress concentration of the flexible display panel main body 20 in the third sub-bending area 2023 and the bonding area 203.

Figure 5:
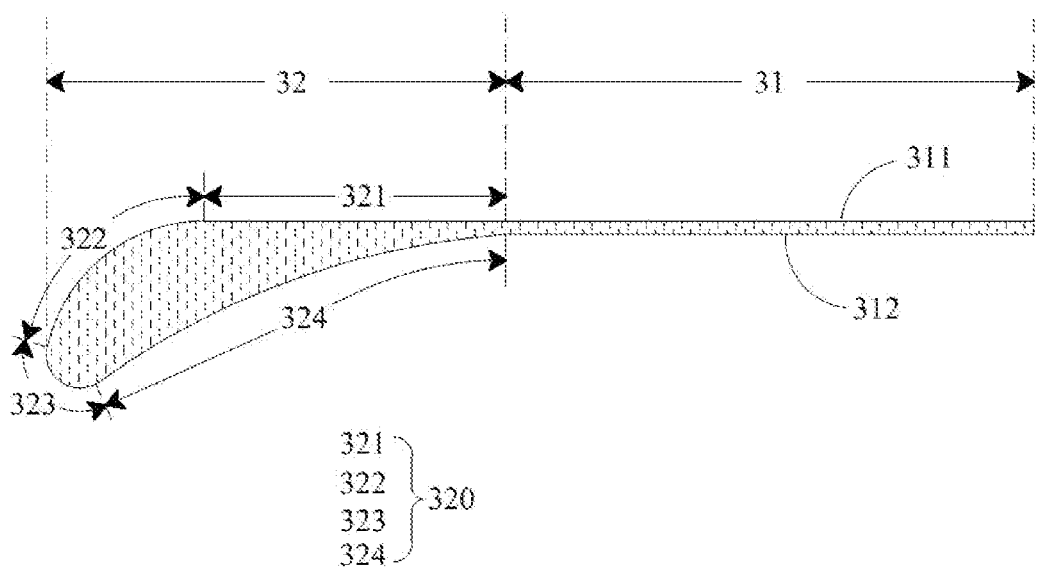
FIG. 5 is a partial structural diagram of another support layer provided by an embodiment of the application.

In other embodiments, as shown in FIG. 5, FIG. 5 is a partial structural diagram of another support layer provided by an embodiment of the application. The second connecting surface 324 may also be a curved surface, completely. The curvature of the curved surface should be smaller than the curvatures of the second curved surface 323 and the first curved surface 322, so that the flexible display panel main body 20 can be smoothly transitioned from the second sub-bending area 2022 to the bonding area 203.

Furthermore, the display panel further comprises a protective layer 26. The protective layer 26 is arranged on a side of the second sub-bending area 2022 of the flexible display panel main body 20 away from the end part 32 and covers the surface of the second sub-bending area 2022. The protective layer 26 can be made of ultraviolet curing glue.

Specifically, since the flexible display panel main body 20 is made of flexible materials, and the bottom of the second sub-bending area 2022 is not supported by the back plate 21. If the protective layer 26 is not provided on the outer surface of the second sub-bending area 2022, the second sub-bending area 2022 cannot always maintain the bending shape as shown in FIG. 3. The second sub-bending area 2022 may be deformed and the film layer inside may be squeezed to cause cracks or breakages in the wirings. By arranging the protective layer 26 on the side of the second sub-bending area 2022 away from the end part 32, the cured protective layer 26 possesses a certain resistance to deformation. This helps the second sub-bending area 2022 to maintain the bending shape shown in FIG. 3, and prevents the second sub-bending area 2022 from being deformed after the bonding process is completed.

Furthermore, the thickness of the end part 32 is greater than a thickness of the plane support part 31. The thickness of the end part 32 depends on the degree of curvature of the cover plate 40, and the greater the degree of curvature of the cover plate 40, the greater the thickness of the end part 32. At the same time, the curvature of the second sub-bending area 2022 of the flexible display panel main body 20 is related to the thickness of the end part 32. In the case of a certain degree of bending the cover plate 40, the greater the thickness of the end part 32, the smaller the curvature of the second sub-bending area 2022, and the smaller the degree of bending of the second sub-bending area 2022. The smaller the amount of deformation produced by the sub-bending area 2022, the smaller the extrusion stress of the inner films. By restricting the thickness of the end part 32 to be greater than the thickness of the plane support part 31, it can be avoided that the thickness of the end part 32 is too small and the bending degree of the second sub-bending area 2022 is too large, which leads to the occurrence of cracks or breakages in the wirings due to stress concentration in the second sub-bending area 2022.

Furthermore, in a direction from the side of the end part 32 away from the plane support part 31 to the side of the end part 32 close to the plane support part 31, the thickness of the end part 32 gradually increases and then gradually decreases.

As shown in FIG. 3 and FIG. 4, in the embodiment of the present application, the maximum thickness of the end part 32 of the support layer is a, and the thickness of the plane support part 31 of the support layer 30 is b, where a is greater than b. Meanwhile, in the direction from the side of the end part 32 away from the plane support part 31 to the side of the end part 32 close to the plane support part 31, the thickness of the end part 32 gradually increases to the thickness a and then gradually decreases to the thickness b.

specifically, in a direction from the side of the end part 32 away from the plane support part 31 to the side of the end part 32 close to the plane support part 31, the thickness of the end part 32 gradually increases to the thickness a, so that the bending shape of the second sub-bending area 2022 presents an outwardly expanded state, which can prevent the curvature of the second sub-bending area 2022 of the flexible display panel main body 20 from being too small, causing the bending stress to concentrate and causing cracks in the internal wirings. In the process that the thickness of the end part 32 gradually decreases from the thickness a to the thickness b i.e. the process in which the third sub-bending area 2023 gradually approaches the plane area 201, the thickness of the end part 32 gradually decreases. The thickness difference between the third sub-bending area 2023 and the plane area 201 also gradually decreases. Then, the flexible display panel main body 20 can also transition from the third sub-bending area 2023 to the bonding area 203 more smoothly.

Furthermore, a material of the support layer 30 comprises metal.

In the embodiment of the present application, the support layer 30 may be made of a metal material. The metal material possesses good plasticity and hardness, and the support layer 30 with a special-shaped structure as shown in FIG. 4 or FIG. 5 can be prepared by a simple stamping or casting molding process. When subjected to an external force, the surface of the support layer 30 will only be slightly deformed or even not deformed, which can effectively support and protect the flexible display panel main body 20.

Specifically, the metal material may comprise, but is not limited to, copper (Cu) or stainless steel (SUS). In practical applications, the material of the support layer 30 is not limited to the metal materials in the foregoing embodiments, and can also be injection molded materials such as rubber or plastic, or foam.

It should be noted that in the prior art shown in FIG. 1, the surface of the backing 12 may be arranged in a curved shape and place it at the bottom of the flexible display panel main body 11 corresponding to the bending area 102. The backing 12 is employed to support the bending area 102 of the display panel main body and form a curved shape with a certain bending radius, while the bottom of the part of the display panel main body 11 corresponding to the plane area 101 is not provided with the backing 12. However, it is difficult to ensure the accuracy of the bonding between the flexible display panel main body 11 and the backing 12, and the bonding is difficult, and it is easy to make the display panel body 11 and the backing 12 not fit tightly. As a result, air bubbles are generated between the display panel main body 11 and the backing 12. Consequently, problems of debonding and peeling between the display panel main body 11 and the backing 12 are likely to occur.

The support layer 30 in the display panel provided by the embodiment of the present application can be obtained by adjusting the film structure and shape of the composite heat dissipation film 14 in the display panel of the prior art shown in FIG. 1. As aforementioned, the composite heat dissipation film 14 can be formed by stacking stainless steel (SUS), copper and foam in sequence. The support layer 30 in the embodiment of the present application can be formed by employing a metal film layer such as stainless steel or copper in the composite heat dissipation film 14 in the prior art shown in FIG. 1. Then, the support layer 30 can possess the functions of heat dissipation, electromagnetic shielding and smooth transition of the display layer 22 in the bending area 202 at the same time. It cannot only omit the backing 12 in the prior art shown in FIG. 1, and the structure of the display panel is simplified, the support layer 30 can also support the plane area 201, the bending area 202 and the bonding area 203 of the flexible display panel main body 20 at the same time, thereby reducing the difficulty of attaching the flexible display panel main body 20 and the support layer 30. Accordingly, the problems of film debonding and peeling of the flexible display panel main body 20 and the support layer 30 can be avoided.

The embodiment of the present application provides a display panel and a display device, and the display panel comprises a flexible display panel main body and a support layer. The support layer comprises a support part and a end part. The plane support part comprises a first surface and a second surface which are oppositely arranged. The end part comprises a transition surface, and the transition surface is respectively connected to the first surface and the second surface. At least part of the transition surface is a curved surface. A part of the flexible display panel main body is arranged on the first surface, and another part of the flexible display panel main body is configured to surround the transition surface and to be arranged on the second surface. The end part can provide support for the flexible display panel main body. The curved surface of the transition surface can make the flexible display panel main body possess a smoother transition as bending. It cannot only reduce the difficulty of bonding process, but also can reduce the stress during the bending process of the flexible display panel main body to avoid the concentration of wiring stress, thereby reducing the risks of breakages in the wirings inside the display panel.

In summary, although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A flexible display panel, comprising:
   a flexible display panel main body comprising a plane area, a bending area provided at at least one end of the plane area and connected to the plane area, and a bonding area connected to the bending area; the bending area comprising a first sub-bending area and a second sub-bending area; and
   a support layer, wherein the support layer comprises:
   a plane support part comprising a first surface and a second surface which are oppositely arranged; and
   an end part comprising a transition surface, wherein the transition surface is respectively connected to the first surface and the second surface, the transition surface comprises a first curved surface and a second curved surface connected to an end of the first curved surface away from the first surface;
   wherein at least part of the transition surface is a curved surface, the plane area is at least partially arranged on the first surface, the bending area is arranged on the transition surface, the bonding area is arranged on the second surface, the first sub-bending area is attached to the first curved surface, and the second sub-bending area forms a gap with the second curved surface.

2. The flexible display panel according to claim 1, wherein a curvature of the first curved surface is smaller than a curvature of the second curved surface.

3. The flexible display panel according to claim 2, wherein the transition surface comprises a first connecting surface, and the first connecting surface is respectively connected to the first surface and the first curved surface;
wherein the first connecting surface is a straight surface.

4. The flexible display panel according to claim 3, wherein the transition surface comprises a second connecting surface, and the second connecting surface is respectively connected to the second curved surface and the second surface;
wherein at least part of the second connecting surface is a curved surface.

5. The flexible display panel according to claim 1, wherein the flexible display panel further comprises a protective layer arranged on a side of the second sub-bending area away from the end part.

6. The flexible display panel according to claim 1, wherein a thickness of the end part is greater than a thickness of the plane support part.

7. The flexible display panel according to claim 6, wherein in a direction from a side of the end part away from the plane support part to a side of the end part close to the plane support part, the thickness of the end part gradually increases and then gradually decreases.

8. The flexible display panel according to claim 1, wherein a material of the support layer comprises metal.

9. The flexible display panel according to claim 1, wherein the flexible display panel further comprises a cover plate, and the cover plate comprises a straight part and a bending part located at at least one end of the straight part.

10. The flexible display panel according to claim 9, wherein the bending part is smoothly transitioned and connected to the straight part, and the bending part is curved toward one side of the flexible display panel main body.

11. A flexible display device, comprising a flexible display panel, wherein the flexible display panel comprises:
a flexible display panel main body comprising a plane area, a bending area provided at at least one end of the plane area and connected to the plane area, and a bonding area connected to the bending area; the bending area comprising a first sub-bending area and a second sub-bending area; and
a support layer, wherein the support layer comprises:
a plane support part comprising a first surface and a second surface which are oppositely arranged; and
an end part comprising a transition surface, wherein the transition surface is respectively connected to the first surface and the second surface, the transition surface comprises a first curved surface and a second curved surface connected to an end of the first curved surface away from the first surface;
wherein at least part of the transition surface is a curved surface, the plane area is at least partially arranged on the first surface, the bending area is arranged on the transition surface, the bonding area is arranged on the second surface, the first sub-bending area is attached to the first curved surface, and the second sub-bending area forms a gap with the second curved surface.

12. The flexible display device according to claim 11, wherein a curvature of the first curved surface is smaller than a curvature of the second curved surface.

13. The flexible display device according to claim 12, wherein the transition surface comprises a first connecting surface, and the first connecting surface is respectively connected to the first surface and the first curved surface;
wherein the first connecting surface is a straight surface.

14. The flexible display device according to claim 13, wherein the transition surface comprises a second connecting surface, and the second connecting surface is respectively connected to the second curved surface and the second surface;
wherein at least part of the second connecting surface is a curved surface.

15. The flexible display device according to claim 11, wherein the flexible display panel further comprises a protective layer arranged on a side of the second sub-bending area away from the end part.

16. The flexible display device according to claim 11, wherein a thickness of the end part is greater than a thickness of the plane support part.

17. The flexible display device according to claim 16, wherein in a direction from a side of the end part away from the plane support part to a side of the end part close to the plane support part, the thickness of the end part gradually increases and then gradually decreases.

18. The flexible display device according to claim 11, wherein a material of the support layer comprises metal.

19. The flexible display device according to claim 11, wherein the flexible display panel further comprises a cover plate, and the cover plate comprises a straight part and a bending part located at at least one end of the straight part.

20. The flexible display device according to claim 19, wherein the bending part is smoothly transitioned and connected to the straight part, and the bending part is curved toward one side of the flexible display panel main body.

* * * * *